US006756273B2

United States Patent
Hadizad et al.

(10) Patent No.: US 6,756,273 B2
(45) Date of Patent: Jun. 29, 2004

(54) SEMICONDUCTOR COMPONENT AND METHOD OF MANUFACTURING

(75) Inventors: Peyman Hadizad, Scottsdale, AZ (US); Jina Shumate, Phoenix, AZ (US); Ali Salih, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 121 days.

(21) Appl. No.: 09/802,726

(22) Filed: Mar. 12, 2001

(65) Prior Publication Data

US 2002/0127831 A1 Sep. 12, 2002

(51) Int. Cl.[7] .............................................. H01L 21/00
(52) U.S. Cl. ........................ 438/269; 438/357; 438/358
(58) Field of Search ........................ 438/250–270, 438/350–360, 275, 199, 223, 224, 229, 227, 183, 415, 416, 589; 257/330, 900

(56) References Cited

U.S. PATENT DOCUMENTS

| | | | |
|---|---|---|---|
| 5,872,421 A | * | 2/1999 | Potter .......................... 313/309 |
| 5,998,288 A | * | 12/1999 | Gardner et al. .............. 438/589 |
| 6,191,446 B1 | * | 2/2001 | Gardner et al. .............. 257/330 |
| 6,210,999 B1 | * | 4/2001 | Gardner et al. .............. 438/183 |
| 6,255,152 B1 | * | 7/2001 | Chen .......................... 438/199 |
| 6,278,165 B1 | * | 8/2001 | Oowaki et al. .............. 257/410 |
| 6,355,955 B1 | * | 3/2002 | Gardner et al. .............. 257/330 |
| 6,410,958 B1 | | 6/2002 | Usui et al. |
| 6,509,240 B2 | | 1/2003 | Ren et al. |
| 6,608,350 B2 | | 8/2003 | Kizner et al. |

* cited by examiner

Primary Examiner—Carl Whitehead, Jr.
Assistant Examiner—Laura M Schillinger

(57) ABSTRACT

A semiconductor component includes a semiconductor layer (110) having a trench (326). The trench has first and second sides. A portion (713) of the semiconductor layer has a conductivity type and a charge density. The semiconductor component also includes a control electrode (540, 1240) in the trench. The semiconductor component further includes a channel region (120) in the semiconductor layer and adjacent to the trench. The semiconductor component still further includes a region (755) in the semiconductor layer. The region has a conductivity type different from that of the portion of the semiconductor layer. The region also has a charge density balancing the charge density of the portion of the semiconductor layer.

18 Claims, 7 Drawing Sheets

SEMICONDUCTOR COMPONENT AND METHOD OF MANUFACTURING

BACKGROUND OF THE INVENTION

This invention relates in general to electronics and, more particularly, to semiconductor components and methods of manufacturing.

Semiconductor components such as, for example, power transistors are used in a wide variety of applications, including telecommunication, computing, and automotive applications. A power transistor typically has a drain electrode located at a bottom side of the power transistor and also has a gate electrode and a source electrode at a top side of the power transistor. This configuration provides the power transistor with a vertical structure. A common problem with this type of power transistor, however, is its high drain-to-source on-resistance.

To reduce the drain-to-source on-resistance, a deep trench super junction has been added to this type of power transistor. The use of a deep trench super junction reduces an electric field intensity within the power transistor to permit the use of a higher doping level within a body of the power transistor. The higher doping level reduces the drain-to-source on-resistance of the power transistor.

One problem with the use of a deep trench super junction in this type of power transistor is the creation of a Junction Field Effect Transistor (JFET) resistance within the power transistor. This JFET resistance is located below the gate region. Another problem with the use of a deep trench super junction in this type of power transistor is the limitation of the minimum size or pitch of the power transistor. The minimum size of the power transistor is determined by the diffusion of the dopant from the super junction. If the size of the power transistor is too small, the super junction will completely and permanently pinch-off the JFET region of the power transistor, and the power transistor will not function properly. The size or pitch limitation limits the reduction of the power transistor's on-resistance.

Hence, there is a need for a semiconductor component having a low drain-to-source on-resistance, a small size, and a minimal JFET resistance. A need also exists for a method of manufacturing this semiconductor component.

BRIEF DESCRIPTION OF THE DRAWINGS

The invention will be better understood from a reading of the following detailed description, taken in conjunction with the accompanying drawing figures in which.

Figure 1:
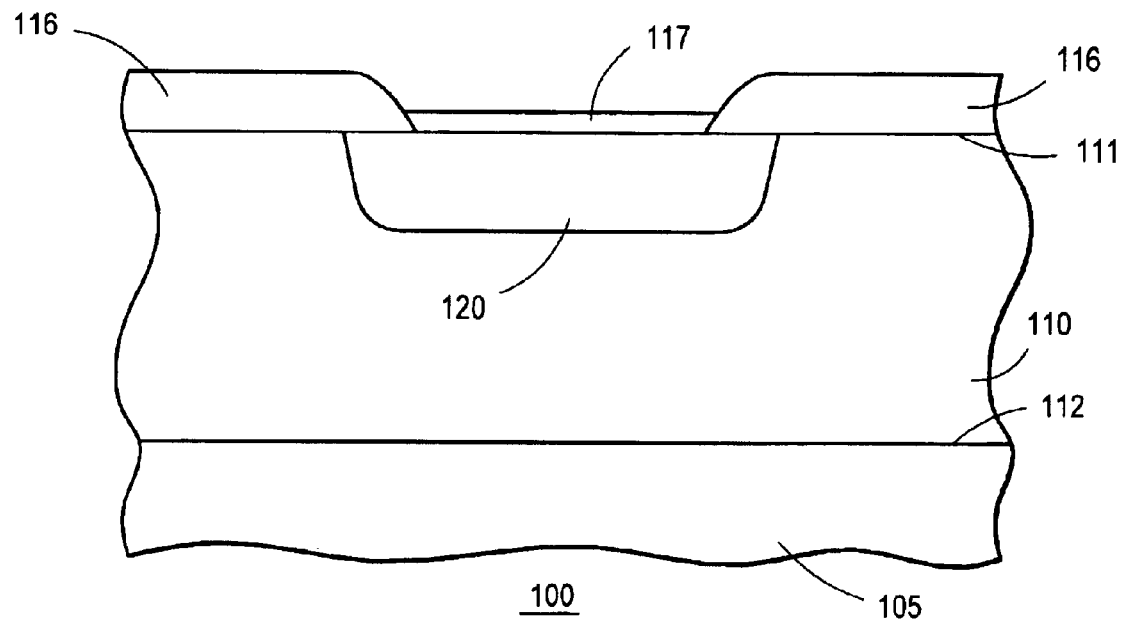
FIG. 1 illustrates a cross-sectional view of a portion of a semiconductor component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

In the preferred embodiment, a semiconductor component comprises at least a power transistor having a vertical structure. Further in the preferred embodiment, the power transistor is a Metal Oxide-Semiconductor FET (MOSFET). In other embodiments, the power transistor can be other types of FETs.

More particularly, the semiconductor component comprises a semiconductor layer having a trench. The trench has two sides opposite each other. A portion of the semiconductor layer has a conductivity type and a charge density or doping concentration. The semiconductor component also comprises a control electrode in the trench and additionally comprises a channel region in the semiconductor layer and adjacent to the trench. The semiconductor component still further comprises a region in the semiconductor layer where the region has a conductivity type different from the conductivity type of the portion of the semiconductor layer. The region in the semiconductor layer also has a charge density that balances the charge density of the portion of the semiconductor layer.

Computer simulations have shown this power transistor to have, among other advantages, a reduction in drain-to-source on-resistance of approximately thirty percent compared to the drain-to-source on-resistances of previous power transistors having similar power ratings. Computer simulations have also shown this power transistor to have, among still other advantages, a reduction in size of up to fifty percent compared to the sizes of previous power transistors having similar power ratings.

The semiconductor component can be a discrete device or an integrated circuit. If the semiconductor component is a discrete device, the semiconductor component consists solely of a single power transistor. If the semiconductor component is an integrated circuit, the semiconductor component can comprise a single power transistor or a plurality of power transistors and can further comprise other types of transistors, resistors, and other types of devices within integrated circuits.

FIG. 1 illustrates a cross-sectional view of a semiconductor component 100. Semiconductor component 100 comprises a semiconductor layer 110. Semiconductor layer 110 can be comprised of a variety of semiconductor materials including, for example, silicon, germanium, silicon germanium, or gallium arsenide. Semiconductor layer 110 can have a crystalline or epitaxial structure.

Semiconductor layer 110 has a surface 111 and a surface 112, which is opposite surface 111. At least a portion of semiconductor layer 110 has a conductivity type and a charge density. In the preferred embodiment, the conductivity type of semiconductor layer 110 is n-type, but in a different embodiment, the conductivity type of semiconductor layer 110 can be p-type. Also in the preferred embodiment, semiconductor layer 110 is deposited, grown, or otherwise formed with the conductivity type and the charge density, but in a different embodiment, semiconductor layer 110 can be doped to have the conductivity type and the charge density after semiconductor layer 110 is formed.

Semiconductor component 100 also comprises a channel region 120. Channel region 120 is formed in semiconductor layer 110. Channel region 120 has a different conductivity type than the portion of semiconductor layer 110. In the preferred embodiment, the conductivity type of channel region 120 is p-type. In a different embodiment where the conductivity type of the portion of semiconductor layer 110 is p-type, the conductivity type of channel region 120 can be n-type.

Semiconductor component 100 further comprises a semiconductor substrate 105. Semiconductor substrate 105 is underneath semiconductor layer 110. In particular, semiconductor substrate 105 is contiguous with surface 112 of semiconductor layer 110.

Semiconductor substrate 105 serves as a portion of a drain region for the power transistor in semiconductor component 100. Semiconductor substrate 105 has the same conductivity type as semiconductor layer 110. Semiconductor substrate 105 has a charge density that is greater than the charge density of semiconductor layer 110 and channel region 120. As an example, semiconductor layer 110 can be epitaxially grown over semiconductor substrate 105.

Semiconductor component 100 still further comprises electrically insulative layers 116 and 117. As an example, electrically insulative layers 116 and 117 can be comprised of silicon dioxide, silicon nitride, silicon oxy-nitride, Tetra-Ethyl-Ortho-Silicate (TEOS), or Spin-On-Glass (SOG). In the preferred embodiment, electrically insulative layers 116 and 117 are both comprised of silicon dioxide.

Also in the preferred embodiment, electrically insulative layers 116 and 117 are formed over surface 111 of semiconductor layer 110 before channel region 120 is formed in semiconductor layer 110. In a different embodiment, electrically insulative layers 116 and 117 can be eliminated from semiconductor component 100. In a further embodiment, electrically insulative layer 116 can be eliminated from semiconductor component 100 while electrically insulative layer 117 remains in semiconductor component 100.

When electrically insulative layers 116 and 117 are present in semiconductor component 100, electrically insulative layer 116 is formed over surface 111 of semiconductor layer 110. Then, electrically insulative layer 116 is etched to expose a portion of surface 111 of semiconductor layer 110. Next, electrically insulative layer 117 is formed over the exposed portion of surface 111 of semiconductor layer 110. As an example, electrically insulative layer 117 can be formed by thermally oxidizing the exposed portion of surface 111 of semiconductor layer 110 to a thickness of approximately twenty to fifty nanometers.

After the formation of electrically insulative layer 117, a dopant is implanted through electrically insulative layer 117 and into surface 111 of semiconductor layer 110 to form channel region 120. In this embodiment, electrically insulative layer 117 serves as an implant screen. The implantation of channel region 120 can occur with or without an implant mask. As an example, an implant dose of approximately $1 \times 10^{13}$ to $1 \times 10^{14}$ atoms per centimeter squared can be used to form channel region 120.

After the implantation of channel region 120, a high temperature step is used to activate the implanted dopant used to form channel region 120. As an example, a temperature of approximately 1000 to 1250 degrees Celsius can be used.

Figure 2:
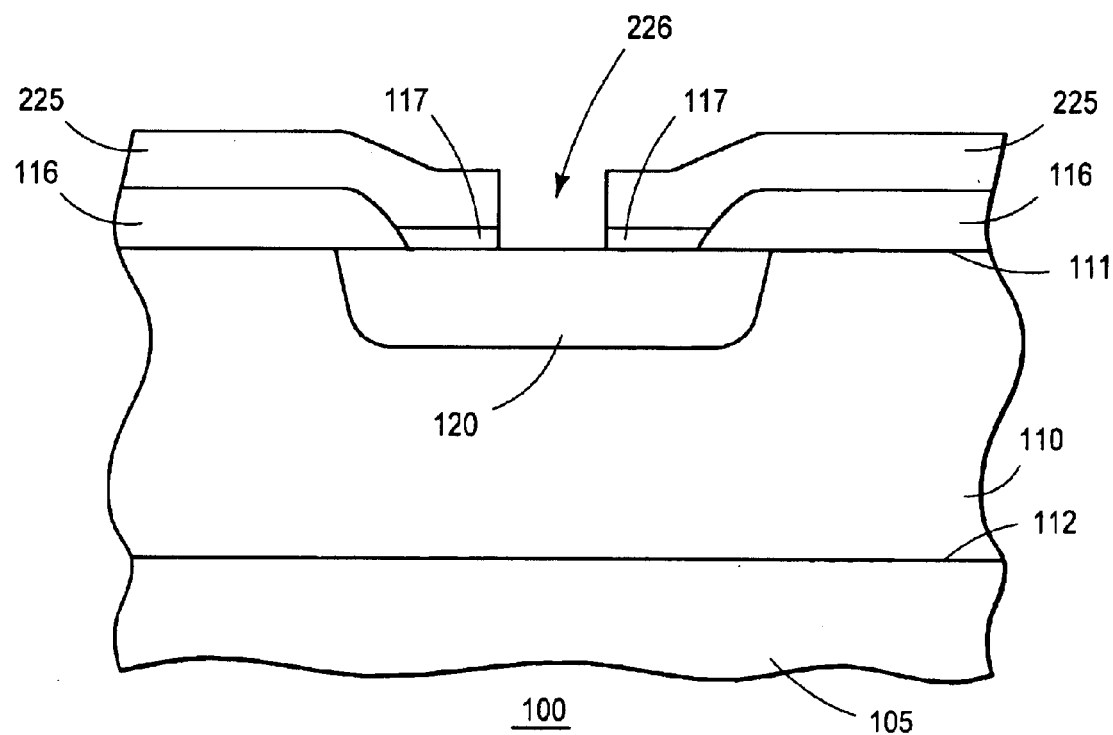
FIG. 2 illustrates a cross-sectional view of the portion of the semiconductor component after subsequent manufacturing steps in accordance with an embodiment of the invention.

FIG. 2 illustrates a cross-sectional view of the portion of semiconductor component 100 after subsequent manufacturing steps. An electrically insulative layer 225 is formed over electrically insulative layers 116 and 117. As an example, electrically insulative layer 225 can be comprised of silicon dioxide, silicon nitride, silicon oxy-nitride, TEOS, or SOG. In the preferred embodiment, electrically insulative layer 225 is comprised of silicon nitride.

A hole 226 is etched into electrically insulative layers 225 and 117. Hole 226 exposes a portion of surface 111 of semiconductor layer 110. Hole 226 is located over channel region 120.

Figure 3:
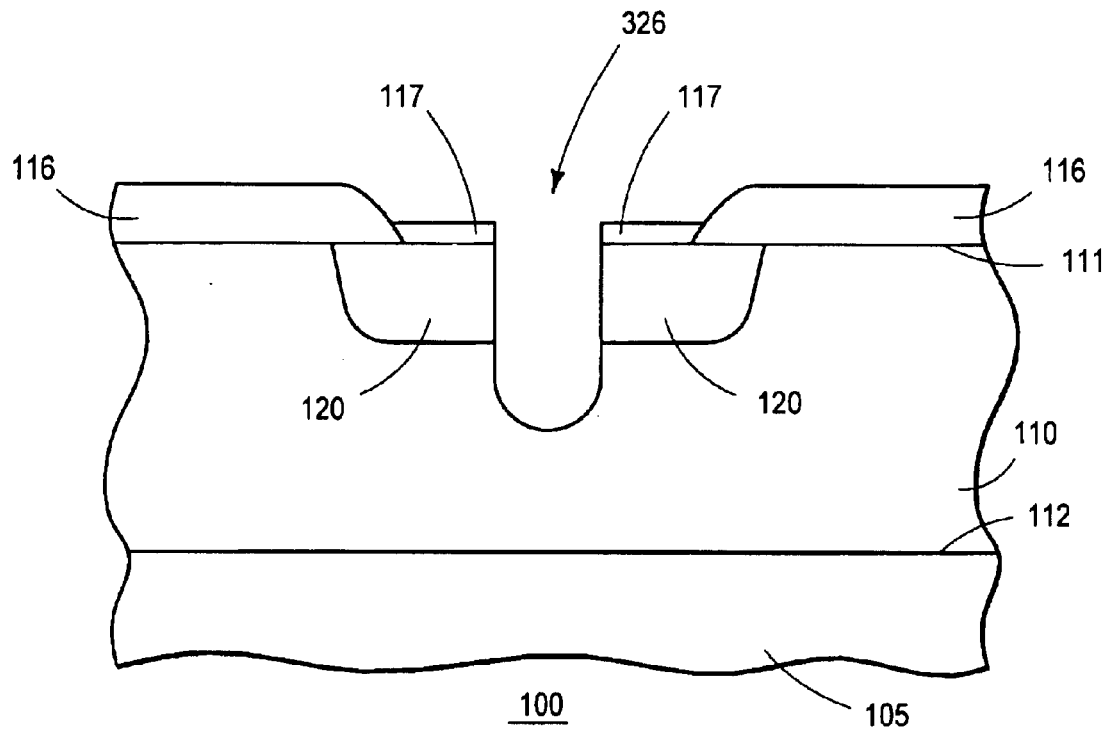
FIG. 3 illustrates a cross-sectional view of the portion of the semiconductor component after further manufacturing steps in accordance with an embodiment of the invention.

FIG. 3 illustrates a cross-sectional view of the portion of semiconductor component 100 after further manufacturing steps. A trench 326 is etched into surface 111 of semiconductor layer 110. As an example, trench 326 can have a depth of approximately one to one-and-a-half microns and a width of less than one micron.

Trench 326 has two sides, each of which is adjacent to, and preferably contiguous with, a different portion of channel region 120. In the preferred embodiment, the side walls of trench 326 located at the sides of trench 326 are perpendicular to surface 111 of semiconductor layer 110. Channel region 120 circumscribes trench 326. Trench 326 can extend into semiconductor layer 110 deeper than channel region 120. In this preferred embodiment, channel region 120 is absent underneath trench 326. Accordingly, the power transistor in semiconductor component 100 preferably has a vertical channel length that is perpendicular to surface 111 of semiconductor layer 110.

Hole 226 (FIG. 2) in electrically insulative layers 225 (FIG. 2) and 117 is used to define trench 326 in semiconductor layer 110. As an example, a Reactive Ion Etch (RIE) process can be used to form trench 326 in semiconductor layer 110 without using a photoresist etch mask. This RIE process can form trench 326 with rounded or non-rounded corners at the bottom of trench 326.

After the formation of trench 326, electrically insulative layer 225 (FIG. 2) is removed. Before the removal of electrically insulative layer 225 (FIG. 2), a sacrificial oxide layer can be thermally grown along the side walls of trench 326 to protect trench 326 during the removal of electrically insulative layer 225 (FIG. 2). After the removal of electrically insulative layer 225 (FIG. 2), the sacrificial oxide layer can also be removed.

In a different embodiment, electrically insulative layer 225 (FIG. 2) can be eliminated from semiconductor component 100. In this embodiment, an etch mask comprised of photoresist can be used to define trench 326 in semiconductor layer 110.

Figure 4:
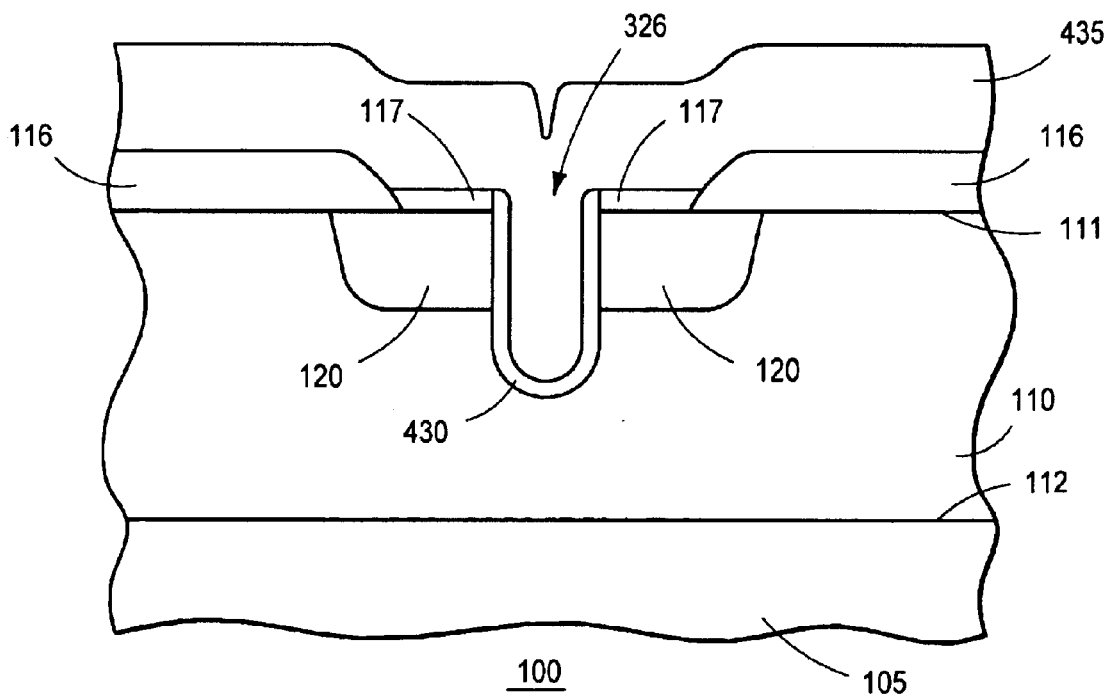
FIG. 4 illustrates a cross-sectional view of the portion of the semiconductor component after still further manufacturing steps in accordance with an embodiment of the invention.

FIG. 4 illustrates a cross-sectional view of the portion of semiconductor component 100 after still further manufacturing steps. An electrically insulative layer 430 is formed in trench 326. When the power transistor of semiconductor component 100 is a MOSFET, electrically insulative layer 430 serves as a gate dielectric layer. If the power transistor in semiconductor component 100 is a Metal-Semiconductor FET (MESFET), electrically insulative layer 430 is not present in trench 326.

As an example, electrically insulative layer 430 can be comprised of silicon dioxide, silicon nitride, silicon oxynitride, TEOS, or SOG. In the preferred embodiment, electrically insulative layer 430 is comprised of silicon dioxide. Also in the preferred embodiment, electrically insulative layer 430 is thermally grown along the side walls of trench 326. Any portions of semiconductor layer 110 forming the side walls of trench 326 that were damaged during the formation of trench 326 or thereafter may need to be removed prior to forming electrically insulative layer 430.

Next, an electrically conductive layer 435 is formed in trench 326 and over electrically insulative layers 116, 117, and 430. In the preferred embodiment, electrically conductive layer 435 is deposited to be electrically conductive. In a different embodiment, electrically conductive layer 435 is first deposited and subsequently doped to be electrically conductive.

As an example, electrically conductive layer 435 can be comprised of doped polycrystalline silicon (polysilicon) or a metal such as, for example, titanium, tungsten, or titanium tungsten. In the embodiment where the power transistor in semiconductor component 100 is a MOSFET, electrically conductive layer 435 can be comprised of in-situ phosphorous-doped polysilicon.

Figure 5:
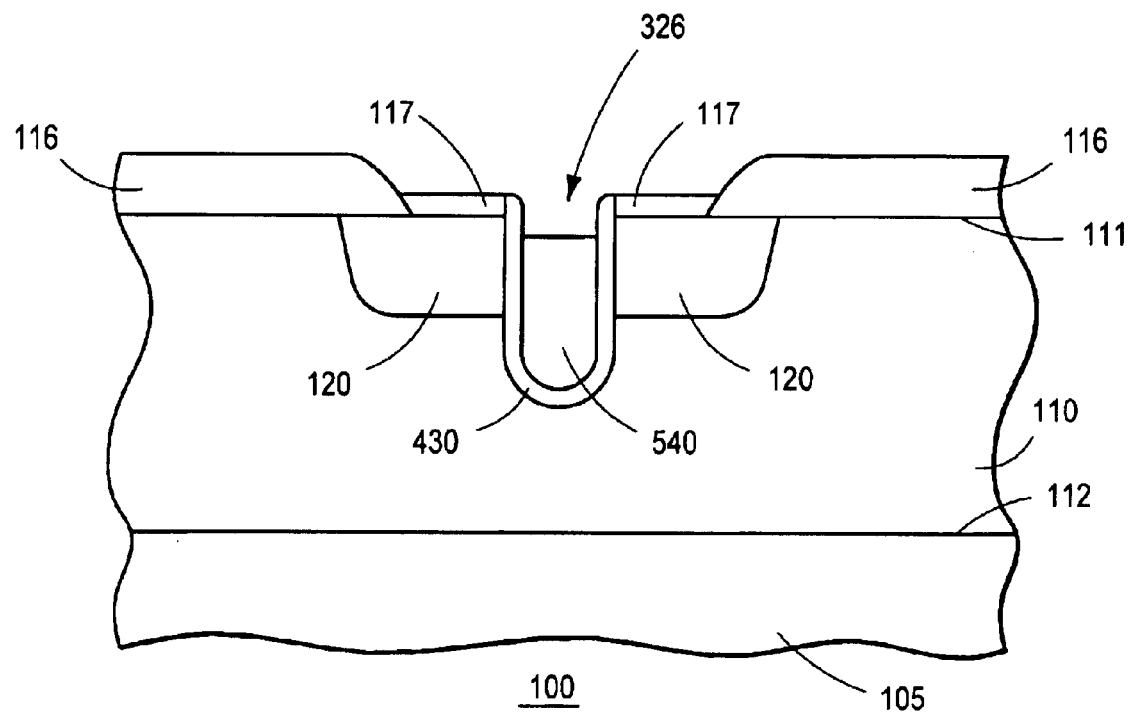
FIG. 5 illustrates a cross-sectional view of the portion of the semiconductor component after yet further manufacturing steps in accordance with an embodiment of the invention.

FIG. 5 illustrates a cross-sectional view of the portion of semiconductor component 100 after yet further manufacturing steps. Electrically conductive layer 435 (FIG. 4) is etched to form a control electrode 540 within trench 326. Electrically insulative layer 430 is located between control electrode 540 and semiconductor layer 110. Control electrode 540 is located adjacent to channel region 120, which circumscribes control electrode 540. Furthermore, control electrode is located preferably only within trench 326 and does not extend out of trench 326.

Figure 6:
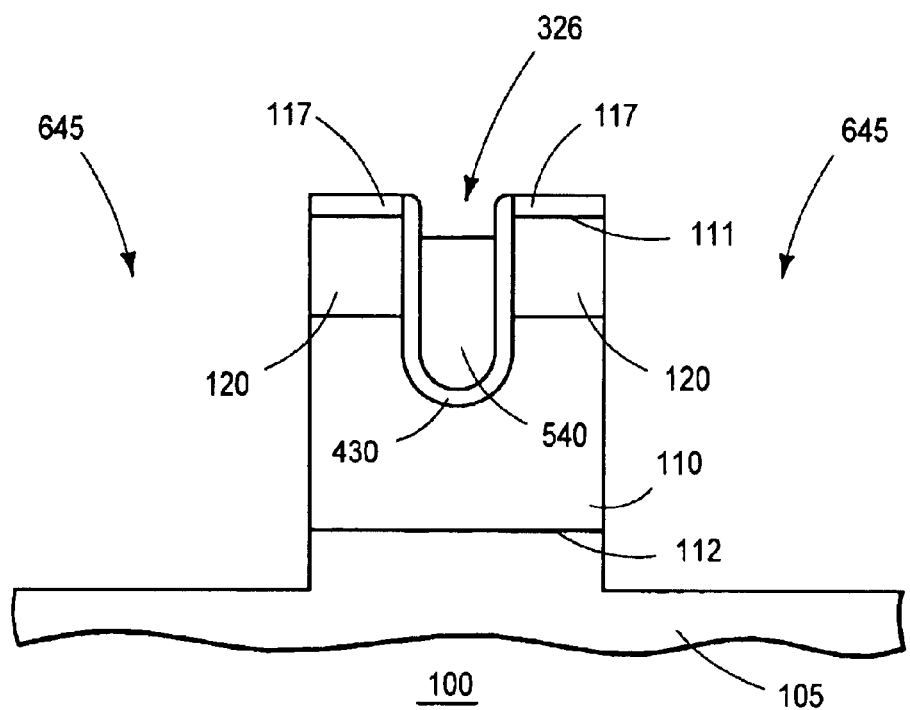
FIG. 6 illustrates a cross-sectional view of the portion of the semiconductor component after additional manufacturing steps in accordance with an embodiment of the invention.

FIG. 6 illustrates a cross-sectional view of the portion of semiconductor component 100 after additional manufacturing steps. A trench 645 is formed in semiconductor layer 110. Trench 645 is first etched through electrically insulative layer 116 (FIG. 5) before being etched into surface 111 of semiconductor layer 110. In the preferred embodiment, trench 645 surrounds the power transistor of semiconductor component 100. As an example, trench 645 can be approximately forty to seventy micrometers deep and approximately two to five micrometers wide.

Trench 645 extends deeper into semiconductor layer 110 from surface 111 of semiconductor layer 110 than trench 326. In the preferred embodiment, trench 645 extends from surface 111 of semiconductor layer 110 to surface 112 of semiconductor layer 110. Furthermore, in the preferred embodiment, trench 645 extends into semiconductor substrate 105. In a different embodiment, trench 645 can be devoid of extending into semiconductor substrate 105. In another embodiment, trench 645 can be devoid of extending to surface 112 of semiconductor layer 110.

Figure 7:
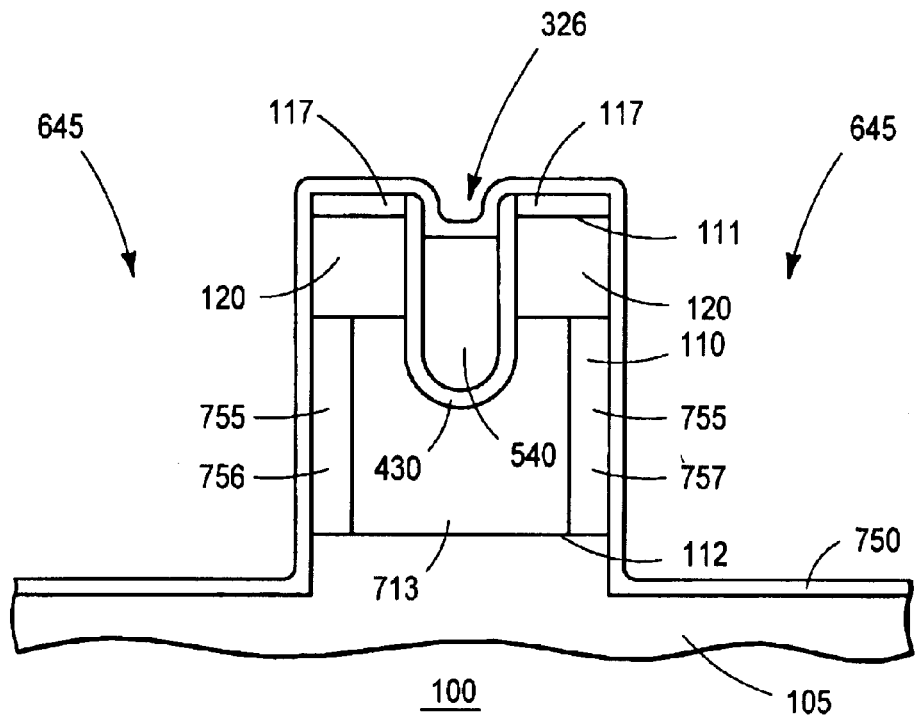
FIG. 7 illustrates a cross-sectional view of the portion of the semiconductor component after subsequent manufacturing steps in accordance with an embodiment of the invention.

FIG. 7 illustrates a cross-sectional view of the portion of semiconductor component 100 after subsequent manufacturing steps. A layer 750 is formed, among other places, along the side walls of trench 645. Layer 750 is doped and has the same conductivity type as channel region 120.

As an example, layer 750 can be comprised of in-situ boron-doped polysilicon or SOG. In another embodiment, layer 750 can be comprised of boron nitride doped with a plasma immersion technique.

In yet another embodiment, layer 750 can be replaced by an epitaxial layer grown along the side walls of trench 645 using a reduced-pressure epitaxial reactor. In this embodiment, the epitaxial layer has a different configuration than illustrated in FIG. 7. In particular, the epitaxial layer can be grown only at exposed portions of semiconductor layer 110. Accordingly, the epitaxial layer would not be formed over electrically insulative layers 117 or 430. As an example, the epitaxial layer can be comprised of silicon, which can be doped in-situ or after being grown.

After the formation of layer 750, semiconductor component 100 is annealed to drive the dopant within layer 750 into semiconductor layer 110. The dopant forms a region 755 in semiconductor layer 110. This annealing process can occur in an inert ambient at approximately 950 to 1050 degrees Celsius.

When layer 750 is comprised of silicon, this annealing process also converts layer 750 into silicon dioxide. This conversion process prevents the formation of a leaky junction along the side walls of trench 645. This conversion process also eliminates any electrically conductive regions over electrically insulative layers 117 and 430.

Region 755 is located adjacent to trench 326. Region 755 has portions 756 and 757. Trench 645 is contiguous with each of portions 756 and 757 of region 755.

Portion 756 of region 755 is at one side of trench 326 and extends along a height of semiconductor layer 110 from surface 112 of semiconductor layer 110 toward surface 111 of semiconductor layer 110. Portion 757 of region 755 is at an opposite side of trench 326 and extends along the height of semiconductor layer 110 from surface 112 of semiconductor layer 110 toward surface 111 of semiconductor layer 110.

In the preferred embodiment, region 755 is continuous. In particular, region 755 extends continuously along the height of semiconductor layer 110 from surface 112 of semiconductor layer 110 toward surface 111 of semiconductor layer 110. More particularly, each of portions 756 and 757 of region 755 are continuous from surface 112 of semiconductor layer 110 toward surface 111 of semiconductor layer 110. Further in the preferred embodiment, portions 756 and 757 are contiguous with each other such that all of region 755 is continuous. In a different embodiment, region 755 may be comprised of a plurality of separate or discontinuous regions.

As illustrated in FIG. 7, region 755 is contiguous with surface 112 of semiconductor layer 110. Depending on the doping concentration of region 755, as explained in more detail hereinafter, region 755 may or may not be contiguous with surface 111 of semiconductor layer 110.

A portion 713 of semiconductor layer 110 is located between portions 756 and 757 of region 755. Portion 713 of semiconductor layer 110 is also located under trench 326. Portion 713 serves as another portion of the drain region for the power transistor in semiconductor component 100. Portion 713 has the conductivity type and the charge density of semiconductor layer 110. Portions 756 and 757 of region 755 extend from the side walls of trench 645 toward the center of portion 713, but preferably do not extend underneath trench 645.

Region 755 has the same conductivity type as channel region 120. Region 755 also has a charge density. The charge density of region 755 balances the charge density of portion 713 of semiconductor layer 110. The charge densities of region 755 and of portion 713 of semiconductor layer 110 are each less than the charge density of semiconductor substrate 105.

If the power transistor in semiconductor component 100 has a lower power rating in the range of approximately one hundred volts, then region 755 has a lower charge density. If, however, the power transistor has a higher power rating in the range of approximately four hundred to one thousand two hundred volts, then region 755 has a higher charged density. As an example, the charge density of region 755 can be approximately $5 \times 10^{12}$ to $1 \times 10^{17}$ atoms per centimeter cubed.

Another factor affecting the charge density of region 755 is the relative size or volume of region 755. The charge density of region 755 can be equal to the charge density of portion 713 of semiconductor layer 110 when region 755 and portion 713 have equal volumes. Similarly, the charge density of region 755 can be greater than the charge density of portion 713 when region 755 has a smaller volume than portion 713, and region 755 can have a lower charge density than portion 713 when region 755 has a larger volume than portion 713.

When the charge density of region 755 is greater than the charge density of portion 713, region 755 can extend completely from surface 112 of semiconductor layer 110 to surface 111 of semiconductor layer 110. In this embodiment, region 755 is contiguous with surfaces 111 and 112 of semiconductor layer 110. Also in this embodiment, channel region 120 is located between portions 756 and 757 of region 755.

Figure 8:
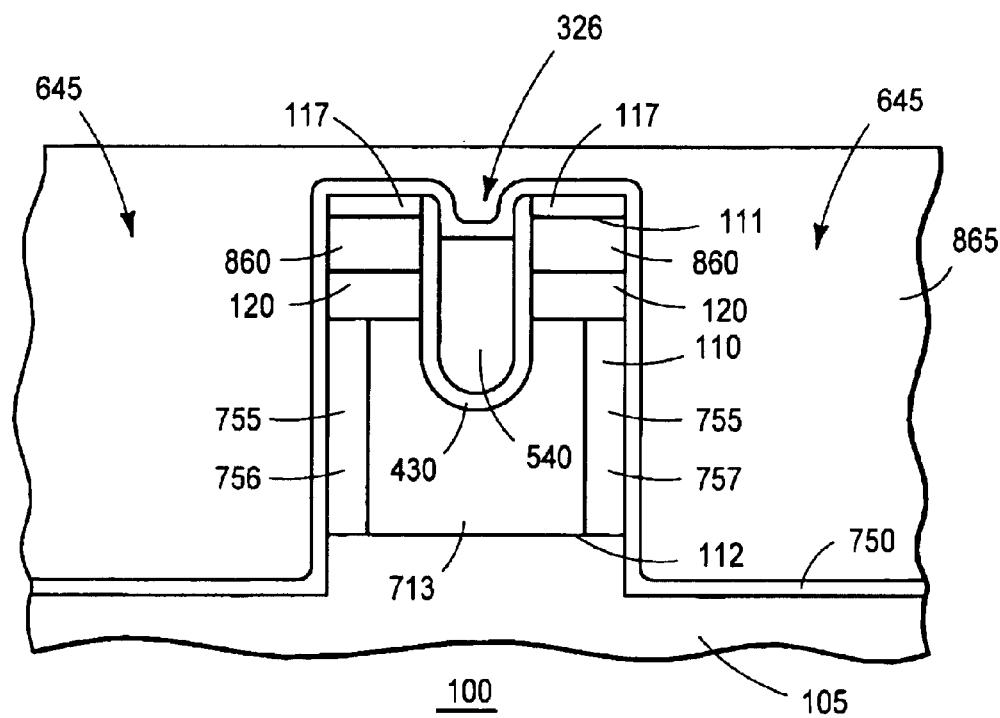
FIG. 8 illustrates a cross-sectional view of the portion of the semiconductor component after further manufacturing steps in accordance with an embodiment of the invention.

FIG. 8 illustrates a cross-sectional view of the portion of semiconductor component 100 after further manufacturing steps. A region 860 is formed in semiconductor layer 110 at surface 111 of semiconductor layer 110. In the preferred embodiment, region 860 completely encircles control electrode 540, but in a different embodiment, region 860 only partially encircles control electrode 540. Region 860 has the same conductivity type as portion 713 of semiconductor layer 110 and is contiguous with trench 326.

Region 860 serves as a source region for the power transistor in semiconductor component 100. Accordingly, the charge density within region 860 is greater than the charge density in channel region 120, portion 713 of semiconductor layer 110, and region 755.

As an example, region 860 can be implanted through layers 750 and 117 into surface 111 of semiconductor layer 110. In the preferred embodiment, the implantation process is performed at a zero degree angle, which is substantially perpendicular to surface 111 of semiconductor layer 110. This implantation process can be performed with or without an implant mask.

Next, trench 645 is filled with an electrically insulative layer 865. As an example, electrically insulative layer 865 can be comprised of undoped polysilicon, silicon dioxide, silicon nitride, silicon oxy-nitride, TEOS, or SOG. In the preferred embodiment, electrically insulative layer 865 is comprised of an electrically insulative material, such as TEOS, that can be deposited at a lower temperature. The lower temperature deposition process does not stress the regions and layers adjacent to trench 645. Electrically insulative layer 865 can be planarized.

Figure 9:
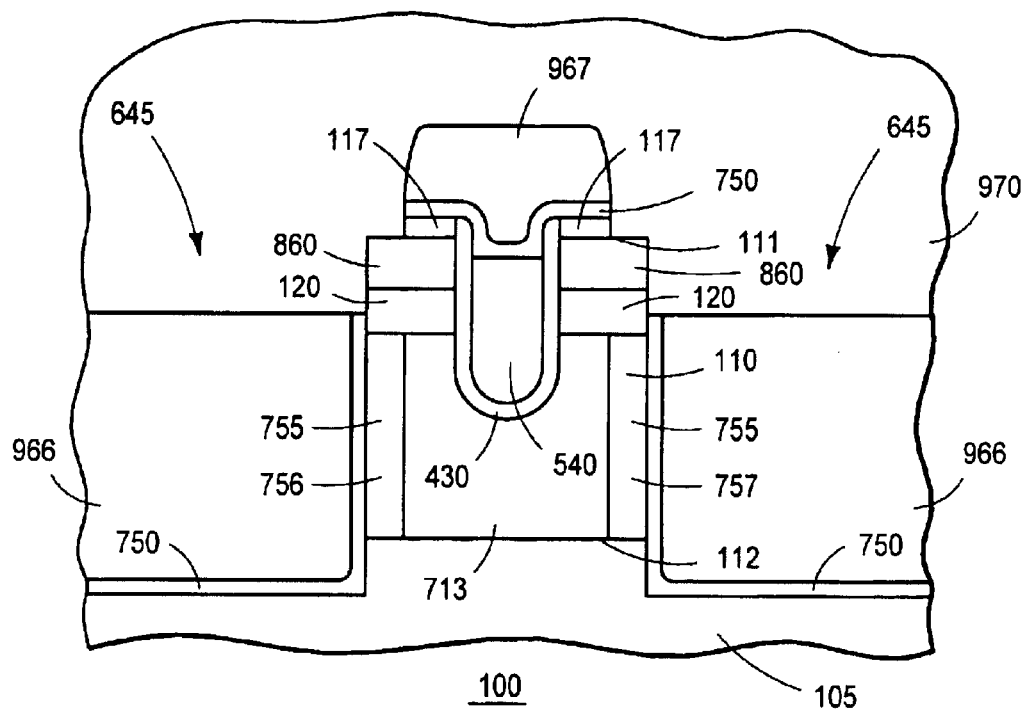
FIG. 9 illustrates a cross-sectional view of the portion of the semiconductor component after still further manufacturing steps in accordance with an embodiment of the invention.

FIG. 9 illustrates a cross-sectional view of the portion of semiconductor component 100 after still further manufacturing steps. Electrically insulative layer 865 (FIG. 8) is etched to leave a portion 966 within trench 645 and a portion 967 over control electrode 540. This etch process also removes portions of layers 750 and 117 to expose portions of region 860 in semiconductor layer 110.

Next, an electrical contact 970 can be formed to contact doped region 860. Electrical contact 970 serves as a source electrode for the power transistor in semiconductor component 100. Semiconductor component 100 also comprises a drain electrode (not shown in FIG. 9) coupled to semiconductor substrate 105. Semiconductor substrate 105 can be thinned before forming the drain electrode.

Figure 10:
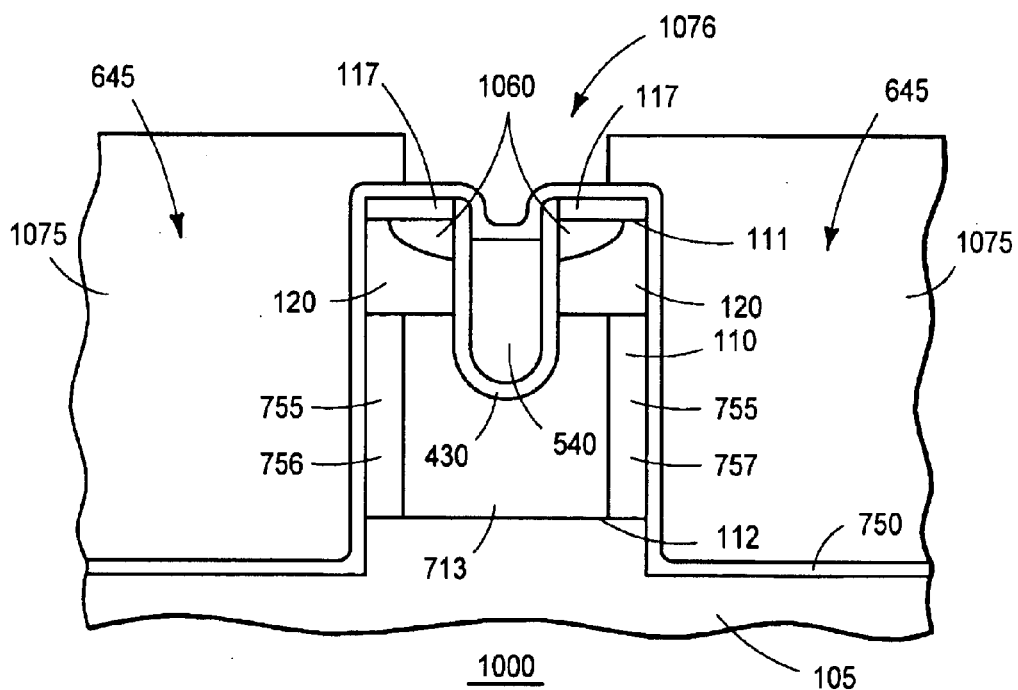
FIG. 10 illustrates a cross-sectional view of a portion of a different semiconductor component in accordance with an embodiment of the invention.

FIG. 10 illustrates a cross-sectional view of a portion of a semiconductor component 1000. Semiconductor component 1000 in FIG. 10 is a different embodiment of semiconductor component 100 (FIG. 9) during an intermediate stage of manufacturing. In particular, semiconductor component 1000 is illustrated in FIG. 10 after a manufacturing step occurring between the completed manufacturing steps illustrated in FIGS. 7 and 8 of semiconductor component 100. More specifically, semiconductor component 1000 in FIG. 10 is illustrated after formation of a region 1060 in semiconductor layer 110.

Region 1060 in FIG. 10 is similar to region 860 (FIG. 8) in semiconductor component 100 (FIG. 8). Accordingly, region 1060 serves as a source region for the power transistor in semiconductor component 1000.

Region 755 is formed in semiconductor layer 110 before region 1060 is formed in semiconductor layer 110. After the formation of region 755, an implant mask 1075 is formed, as illustrated in FIG. 10. Implant mask 1075 is used to define the location and/or configuration of region 1060 within semiconductor layer 110. As an example, implant mask 1075 can be comprised of photoresist. Similar to region 860 in FIG. 8, region 1060 in FIG. 10 can be formed by an ion implantation process.

The location and/or configuration of region 1060, as illustrated in FIG. 10, improves the electrical performance of the power transistor in semiconductor component 1000. After the formation of region 1060, implant mask 1075 is removed, and electrically insulative layer 865 (FIG. 8) is formed. With the exception of region 1060 in semiconductor component 1000 and region 860 (FIG. 8) in semiconductor component 100 (FIG. 8), semiconductor components 100 and 1000 can be identical with each other.

Figure 11:
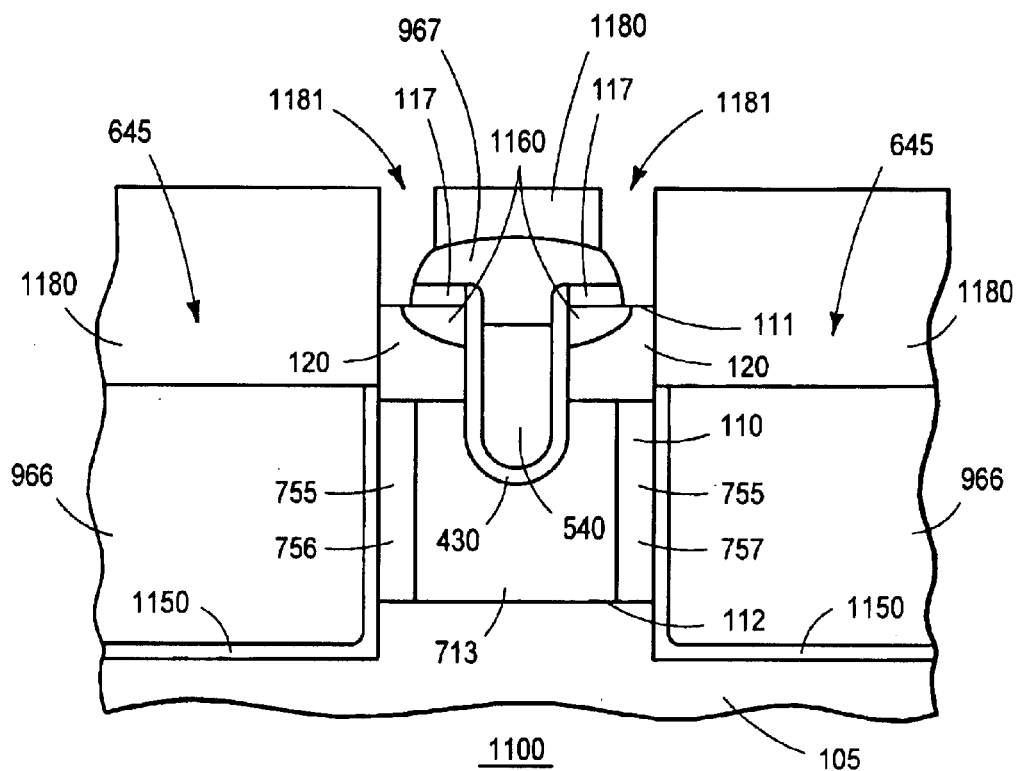
FIG. 11 illustrates a cross-sectional view of a portion of another semiconductor component in accordance with an embodiment of the invention.

FIG. 11 illustrates a cross-sectional view of a portion of a semiconductor component 1100. Semiconductor component 1100 in FIG. 11 is a different embodiment of semiconductor component 100 (FIG. 9) during an intermediate stage of manufacturing. In particular, semiconductor component 1100 is illustrated in FIG. 11 after a manufacturing step occurring between the completed manufacturing steps illustrated in FIGS. 8 and 9 of semiconductor component 100. More specifically, semiconductor component 1100 in FIG. 11 is illustrated after a modification of the source region of the power transistor in semiconductor component 1100.

After the formation of region 860 (FIG. 8) in semiconductor layer 110 and after the patterning of electrically insulative layer 865 (FIG. 8) into portions 966 and 967, an implant mask 1180 is formed, as illustrated in FIG. 11. As an example, implant mask 1180 can be comprised of photoresist. Implant mask 1180 is used to define the location and/or configuration of an implanted region in semiconductor layer 110.

The implanted region converts a portion of region 860 (FIG. 8) back to channel region 120. Accordingly, the implanted region changes the shape and/or configuration of region 860 (FIG. 8) to a region 1160. In a different embodiment, the implanted region can convert a portion of region 860 (FIG. 8) back to region 755.

The location and/or configuration of region 1160, as illustrated in FIG. 11, improves the electrical performance of the power transistor in semiconductor component 1100. After the formation of region 1160, implant mask 1180 is removed, and electrical contact 970 (FIG. 9) is formed.

Semiconductor component 1100 in FIG. 11 can also have another difference from semiconductor component 100 in FIG. 7. In particular, layer 750 of semiconductor component 100 in FIG. 7 is changed to an epitaxial layer that is formed only on the exposed portions of semiconductor layer 110. This epitaxial layer is represented in FIG. 11 by a layer 1150. Layer 1150 is not formed over electrically insulative layer 117. Layer 1150 may or may not be formed over control electrode 540. In FIG. 11, layer 1150 is not illustrated to be located over control electrode 540.

With the exception of region 1160 and layer 1150 in semiconductor component 1100 and region 860 and layer 750 in semiconductor component 100, semiconductor components 100 and 1100 can be identical with each other.

Figure 12:
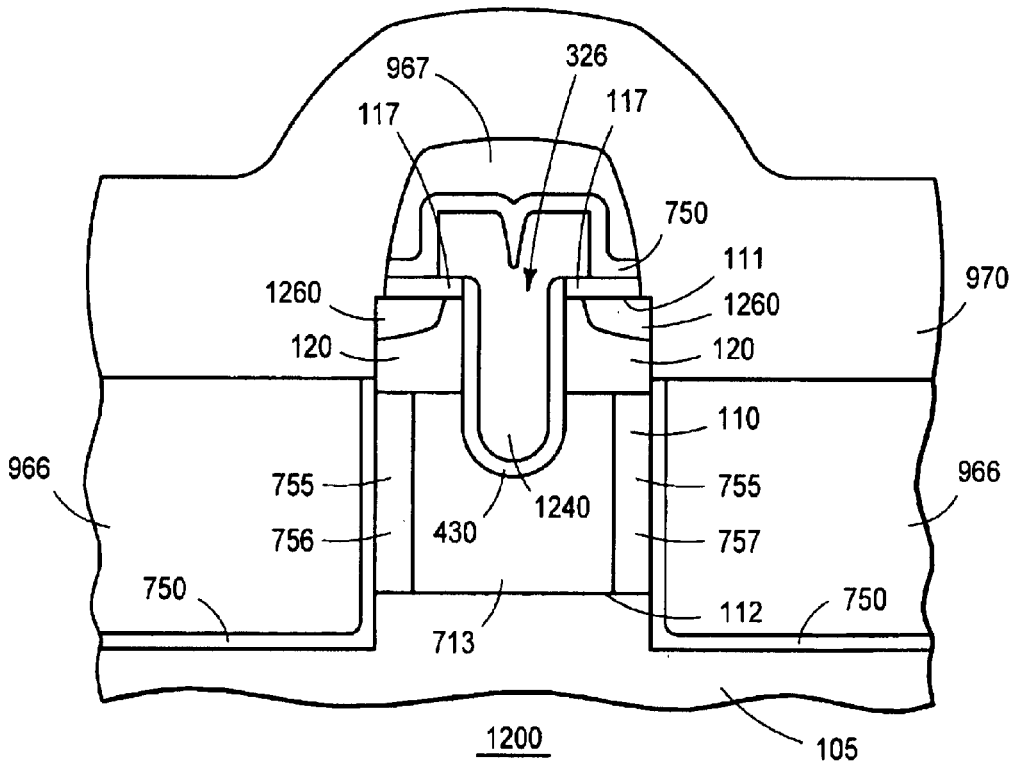
FIG. 12 illustrates a cross-sectional view of a portion of yet another semiconductor component in accordance with an embodiment of the invention.

FIG. 12 illustrates a cross-sectional view of a portion of a semiconductor component 1200. Semiconductor component 1200 in FIG. 12 is a different embodiment of semiconductor component 100 in FIG. 9. Semiconductor component 1200 has a control electrode 1240. Control electrode 1240 of semiconductor component 1200 in FIG. 12 is different from control electrode 540 of semiconductor component 100 in FIG. 9. In particular, control electrode 1240 in FIG. 12 extends out of trench 326 and overlaps surface 111 of semiconductor layer 110 while control electrode 540 in FIG. 9 does not extend out of trench 326.

Control electrode 1240 changes the configuration of subsequently formed layer 750. Control electrode 1240 also changes the configuration of subsequently formed source region, or a region 1260, for the power transistor in semiconductor component 1200. Region 1260 in FIG. 12 is similar to region 860 in FIG. 9, but region 1260 in FIG. 12 is non-contiguous with trench 326. Control electrode 1240 further changes the configurations of subsequently formed portion 967 and electrical contact 970. Aside from these exceptions, semiconductor components 100 and 1200 can be identical with each other.

Figure 13:
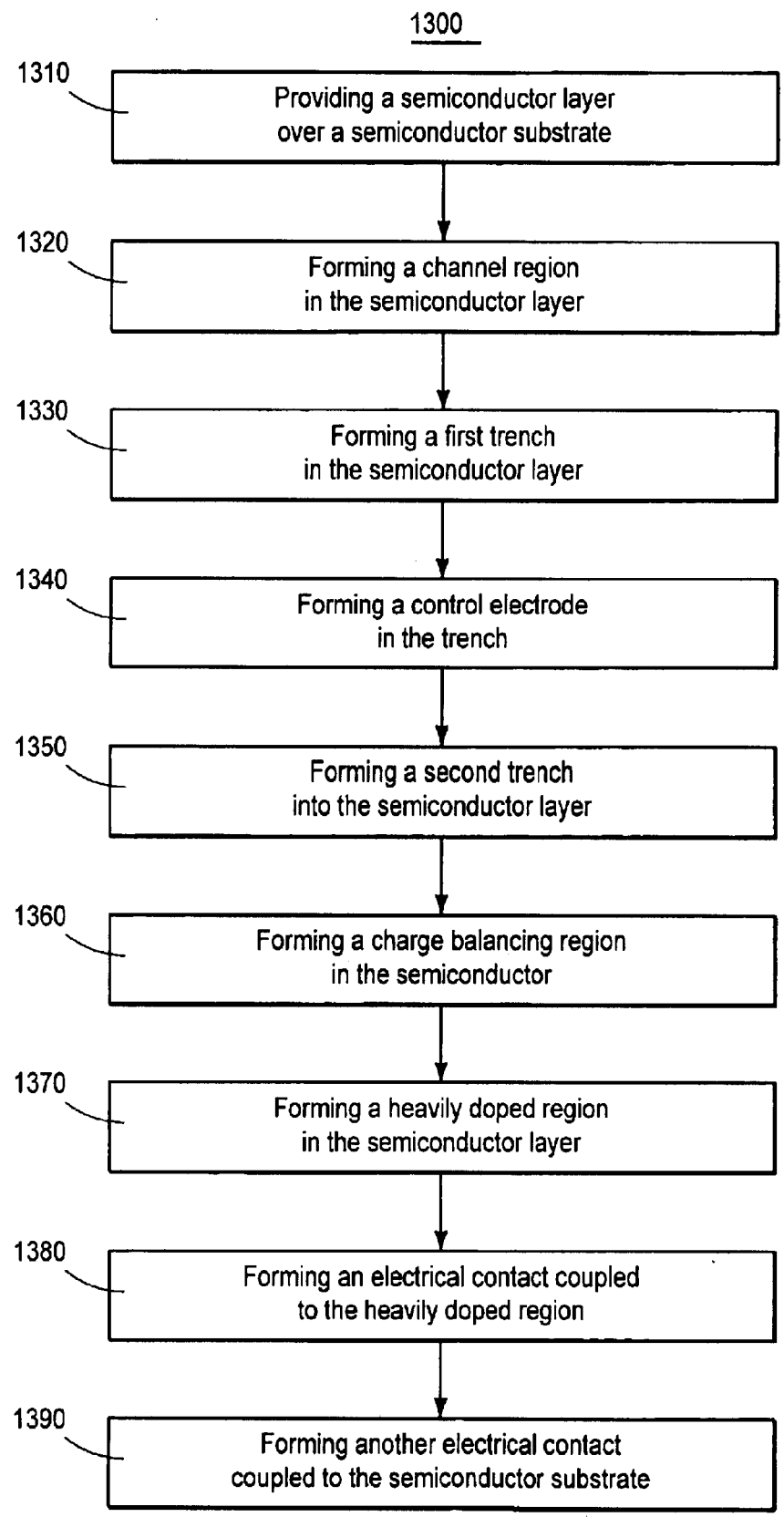
FIG. 13 illustrates a flow chart of a method of manufacturing a semiconductor component in accordance with an embodiment of the invention.

FIG. 13 illustrates a flow chart 1300 of a method of manufacturing a semiconductor component. As an example, the semiconductor component of flow chart 1300 can be similar to semiconductor component 100 in FIG. 9, semiconductor component 1000 in FIG. 10, semiconductor component 1100 in FIG. 11, or semiconductor component 1200 in FIG. 12.

At a step 1310 of flow chart 1300 in FIG. 13, a semiconductor layer is provided over a semiconductor substrate. As an example, the semiconductor layer and the semiconductor substrate of step 1310 in FIG. 13 can be similar to semiconductor layer 110 and semiconductor substrate 105, respectively, in FIG. 1.

Then, at a step 1320 of flow chart 1300 in FIG. 13, a channel region is formed in the semiconductor layer. As an example, the channel region of step 1320 in FIG. 13 can be similar to channel region 120 in FIG. 1.

Next, at a step 1330 of flow chart 1300 in FIG. 13, a trench is formed in the semiconductor layer. The trench of step 1330 is a shallow trench. As an example, the trench of step 1330 in FIG. 13 can be similar to trench 326 in FIG. 3.

Subsequently, at a step 1340 of flow chart 1300 in FIG. 13, a control electrode is formed in the trench. As an example, the control electrode of step 1340 can be similar to control electrode 540 in FIG. 5 or control electrode 1240 in FIG. 12.

Continuing with a step 1350 of flow chart 1300 in FIG. 13, another trench is formed in the semiconductor layer. The trench of step 1350 is a deep trench. As an example, the trench of step 1350 in FIG. 13 can be similar to trench 645 in FIG. 6.

Then, at a step 1360 of flow chart 1300 in FIG. 13, a charge balancing region is formed in the semiconductor layer. As an example, the charge balancing region of step 1360 in FIG. 13 can be similar to region 755 in FIG. 7.

Next, at a step 1370 of flow chart 1300 in FIG. 13, a heavily doped region is formed in the semiconductor layer. As an example, the heavily doped region of step 1370 in FIG. 13 can be similar to region 860 in FIG. 8, region 1060 in FIG. 10, region 1160 in FIG. 11, or region 1260 in FIG. 12.

Subsequently, at a step 1380 of flow chart 1300 in FIG. 13, an electrical contact is formed to be coupled to the heavily doped region. As an example, the electrical contact of step 1380 in FIG. 13 can be similar to electrical contact 970 of FIG. 9.

Continuing with a step 1390 of flow chart 1300 in FIG. 13, another electrical contact is formed to be coupled to the semiconductor substrate. As an example, the electrical contact of step 1390 can be similar to the drain electrode described earlier with reference to FIG. 9.

In summary, an improved semiconductor component and method of manufacturing is provided to overcome the disadvantages of the prior art. The semiconductor component described herein has a shallow trench and a deep trench. The deep trench is used to form a super junction to lower the drain-to-source on-resistance of the power transistor in the semiconductor component. The shallow trench further lowers the drain-to-source on-resistance by eliminating, or at least reducing, the JFET resistance.

The use of the shallow trench also eliminates the minimum spacing requirement for the JFET region in the power transistors of the prior technologies. With the use of the shallow trench, the minimum spacing requirement of the charge balancing region is controlled by lithographic and etching limitations, which can easily be controlled to within the sub-micrometer range. Computer simulations have shown that, for an equal value of on-resistance, the power transistor of the semiconductor component described herein can have a fifty percent reduction in size compared to the power transistors of the prior technologies.

Although the invention has been described with reference to specific embodiments, those skilled in the art will understand that various changes may be made without departing from the spirit or scope of the invention. For instance, the numerous details set forth herein such as, for example, the compositions, locations, and configurations of the layers and regions are provided to facilitate the understanding of the invention and are not provided to limit the scope of the invention. As an additional example, other electrically conductive layers and/or electrically insulative layers can be added to the semiconductor components described herein. For instance, control electrode 540 in FIG. 9 can be comprised of a plurality of electrically conductive layers. Moreover, trench 645 in FIG. 9 can be filled with additional electrically insulative and/or conductive layers.

As another example, semiconductor substrate 105 can be eliminated from semiconductor component 100 in FIG. 9 such that a drain electrode can be connected directly to surface 112 of semiconductor layer 110. Furthermore, layer 750 in component 100 can be eliminated, and an ion implantation process and a diffusion process can be used to form region 755 directly in semiconductor layer 110. Moreover, the various concepts described earlier in this paragraph, in the preceding paragraph, in semiconductor component 100 in FIGS. 1–9, in semiconductor component 1000 in FIG. 10, in semiconductor component 1100 in FIG. 11, and in semiconductor component 1200 in FIG. 12 can be selectively combined with each other.

Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A semiconductor component comprising:
   a drain region having a trench with first and second aides, a portion of the drain region having a first conductivity type and a first charge density;
   a control electrode in the trench;
   a channel region of the second conductivity type adjacent to the drain region and adjacent to the trench; and
   a first region adjacent to the drain region, having a second conductivity type, and having a second charge density balancing the first charge density.

2. The semiconductor component of claim 1, wherein:
   the drain region has a first surface and a second surface;
   a first portion of the first region is at the first side of the trench and extends along a height of the drain region from the first surface of the drain region toward the second surface of the drain region; and
   a second portion of the first region is at the second side of the trench end extends along the height of the drain region from the first surface of the drain region toward the second surface of the drain region.

3. The semiconductor component of claim 2, wherein the first region is discontinuous.

4. The semiconductor component of claim 3, wherein the first portion of the first region is discontinuous.

5. The semiconductor component of claim 2, wherein the first region is continuous.

6. The semiconductor component of claim 5, wherein the first region is continuous from the first surface of the drain region toward the second surface of the drain region.

7. The semiconductor component of claim 2, wherein:
   the first region is contiguous with the first surface of the drain region; and
   the trench is in the second surface of the drain region.

8. The semiconductor component of claim 2, wherein the channel region is between the first and second portions of the first region.

9. The semiconductor component of claim 1, further comprising an electrically insulative layer in the trench between the drain region and the control electrode.

10. The semiconductor component of claim 1, wherein the control electrode is located only in the trench.

11. The semiconductor component of claim 10, wherein:
    the drain region has a first surface and a second surface;
    the trench is in the second surface of the drain region; and
    the semiconductor component further comprises a second region in the drain region, at the second surface of the drain region, having the first conductivity type, and contiguous with the trench.

12. The semiconductor component of claim 1, wherein:
    the drain region has a first surface and a second surface;
    the trench is in the second surface of the drain region; and
    the control electrode overlaps the second surface of the drain region.

13. The semiconductor component of claim 12, further comprising a second region in the drain region, at the second surface of the drain region, having the first conductivity type, and adjacent to and non-contiguous with the trench.

14. The semiconductor component of claim 1, wherein the trench extends into the drain region deeper than the channel region.

15. The semiconductor component of claim 1, wherein the channel region is absent underneath the trench.

16. The semiconductor component of claim 1, wherein the first region is absent underneath the trench.

17. The semiconductor component, of claim 1, wherein the portion of the drain region is located under the trench.

18. The semi-conductor component of claim 1, wherein:
    the drain region has a first surface and a second surface;
    a first portion of the first region is at the first side of the trench and extends along a height of the drain region from the first surface of the drain region toward the second surface of the drain region;
    a second portion of the first region is at the second side of the trench and extends along the height of the drain region from the first surface of the drain region toward the second surface of the drain region; and
    the portion of the drain region is located between the first and second portions of the first region.

* * * * *